(12) United States Patent
Iwazaki

(10) Patent No.: US 6,445,401 B2
(45) Date of Patent: Sep. 3, 2002

(54) LIGHT POWER MODULATING SYSTEM

(75) Inventor: Shoji Iwazaki, Tokyo (JP)

(73) Assignee: Asahi Kogaku Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/747,968

(22) Filed: Dec. 27, 2000

(30) Foreign Application Priority Data

Dec. 27, 1999 (JP) ............................................ 11-369190

(51) Int. Cl.[7] .............................................. G03G 15/04
(52) U.S. Cl. ....................................... 347/133; 347/246
(58) Field of Search ................................. 347/132, 133, 347/236, 246

(56) References Cited

U.S. PATENT DOCUMENTS

| | | | | |
|---|---|---|---|---|
| 4,477,821 A | * | 10/1984 | Yamamoto et al. | 347/246 |
| 5,225,850 A | * | 7/1993 | Egawa et al. | 347/246 |
| 5,973,719 A | | 10/1999 | Araki et al. | |
| 6,114,682 A | * | 9/2000 | Minakuchi et al. | 347/133 |
| 6,222,580 B1 | * | 4/2001 | Yamada | 347/132 |
| 6,266,078 B1 | * | 7/2001 | Koga et al. | 347/236 |

FOREIGN PATENT DOCUMENTS

JP 10-166644 * 6/1998

* cited by examiner

*Primary Examiner*—Susan S. Y. Lee
(74) *Attorney, Agent, or Firm*—Greenblum & Bernstein, P.L.C.

(57) ABSTRACT

In a light power modulating system for modulating output power of a laser diode, an output power of the laser diode is monitored and a voltage signal corresponding to the detected output power is output. An image signal output system is provided to form an image signal representative of a thickness density of an image to be formed, and a modifying system modifies the image signal such that a changing rate of the image signal between a lower value and a higher value is lowered. A differential amplifier outputs an amplified difference between the modified image signal and the voltage signal, and a driving current to be supplied to the laser diode is generated based on the amplified difference output by the differential amplifier.

14 Claims, 8 Drawing Sheets

FIG.5A Vdata
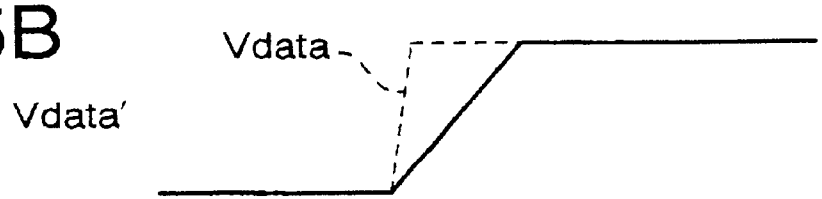
FIG.5B Vdata'
FIG.5C Vmon
FIG.5D Id'
FIG.5E Id

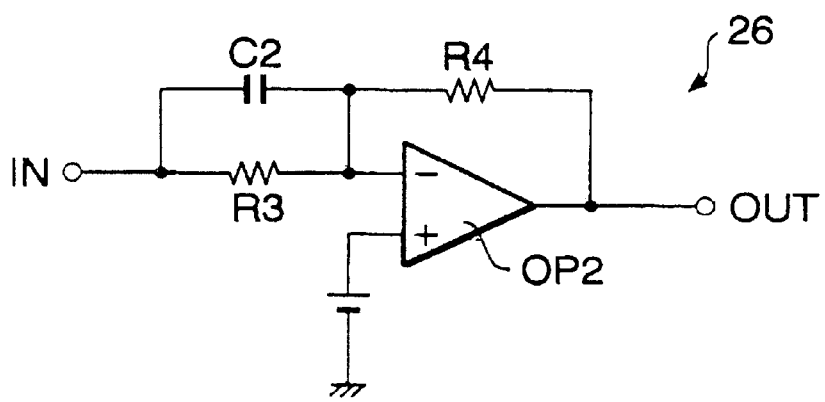
FIG.7A
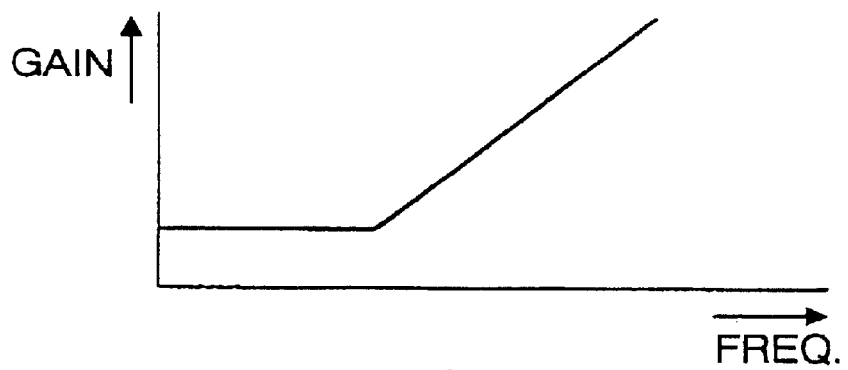
FIG.7B
FIG.7C
FIG.7D

Vdata

Vmon'

Vdef

Vdef'

Id

LIGHT POWER MODULATING SYSTEM

BACKGROUND OF THE INVENTION

The present invention relates to a light power modulating system employed in a scanning optical system for a laser beam printer.

A scanning optical system, which is employed, for example, in a laser beam printer, is provided with a light power modulating circuit for modulating a laser beam directed to a surface of a photoconductive drum. The light power modulating circuit modulates the laser beam, which is emitted by the laser diode, according to an image signal transmitted from an external device to form a latent image on the photoconductive drum.

However, it is known that an output power of the laser diodes varies with temperature and/or time. In addition, characteristics of an output power differ among laser diodes even though the specification is the same.

In order to avoid individual differences of the output power of the laser diodes due to causes described above, the light power modulating circuit generally has a function of an automatic power controller (APC). In the light power modulating circuit, an output power of the laser diode is monitored using a photodiode, and then the electrical current supplied to the laser diode is adjusted based on the monitored output power of the laser diode.

FIG. 1 schematically shows a circuit diagram of the light power modulating circuit having the APC function. As shown in FIG. 1, image data Sdata is input to a D/A converter 21, which converts the image data (Sdata) to an analog image signal (Vdata). This analog image signal (Vdata) is input to a positive input terminal of a differential amplifier 22.

The differential amplifier 22 outputs a differential amplification signal Vdef representing an amplified difference between the input analog image signal (Vdata) and a monitor signal (Vmon) corresponding to the current output power of the laser beam. The differential amplification signal Vdef is input to a voltage-to-current (V-I) converter 23.

The voltage-to-current (V-I) converter 23 generates a driving current (Id) responsive to the amplitude of the differential amplification signal Vdef. Then, a laser diode LD emits a laser beam whose intensity corresponds to the driving current Id.

When the laser diode LD emits the laser beam, for example, to perform a scanning operation, a backwardly emitted laser beam (a back beam) is received by a photodiode PD, which generates a monitor current (Imon) responsive to the intensity of the back beam. It should be noted that the intensity of the back beam is proportional to that of the normal (i.e., the forwardly emitted) laser beam used for the scanning operation. The monitor current (Imon) is input to a current-to-voltage (I-V) converter 24, which generates a monitor voltage (Vmon) corresponding to the monitor current (Imon).

As shown in FIG. 1, the monitor voltage Vmon is applied to a negative input terminal of the differential amplifier 22, while the analog data singal Vdata is input to the positive input terminal of the differential amplifier 22.

If the output power of the laser diode LD decreases due to, for example, deterioration with time, the monitor voltage Vmon decreases, thereby the differential amplification signal (Vdef) increases. As the differential amplification signal (Vdef) increases, the driving current (Id) increases, thereby the output power of the laser diode LD also increases.

If the output power increases, on the contrary, due to, for example, thermal variations, then the monitor voltage (Vmon) increases, thereby the differential amplification signal (Vdef) decreases. As the differential amplification signal (Vdef) decreases, the driving current (Id) decreases, thereby the output power of the laser diode LD also decreases.

In the light power modulating circuit shown in FIG. 1, the output power of the laser diode LD (i.e., the driving current Id) is controlled such that the monitor voltage Vmon coincides with the voltage Vdata. In other words, the automatic power control is performed.

It should be noted that, if the analog data signal Vdata applied to the positive input terminal of the differential amplifier 22 varies as the image signal Sdata varies, the driving current (Id) varies accordingly. Thus, the output power of the laser diode LD is modulated, using the APC function, in accordance with the:image data (Sdata).

In the light power modulating circuit shown in FIG. 1, when a response of the V-I converter 23 or the I-V converter 24 is not sufficiently fast, if the analog signal (Vdata) increases rapidly, the differential amplification signal (Vdef) also must increase rapidly. Furthermore, due to slow response of the V-I converter 23 or the I-V converter 24, the monitor voltage Vmon does not increase immediately. Then, the differential amplification signal Vref remains relatively large for a certain period of time. This will cause the V-I converter 23 to generate a surge current which may cause destruction of the laser diode LD. If the analog data signal (Vdata) decreases rapidly and the differential amplification signal (Vdef) decreases rapidly, the driving current (Id) generated by the V-I converter 23 decreases significantly. In such a case, the output power of the laser diode drops significantly, and becomes lower than necessary.

For this reason, a feedback time that is defined as a time period, within which the monitor voltage Vmon reflecting the change of the analog data signal Vdata is input to the differential amplifier 22, should be relatively short. In order to shorten the feedback time, the differential amplifier 22, the V-I converter 23, and I-V converter 24 must be constructed with quick response type electronic parts. However, such quick response type parts are expensive.

In addition, the feedback time is a sum of the response times of the differential amplifier 22, V-I converter 23, and I-V converter 24. Accordingly, it has been difficult to decrease the feedback time sufficiently in the light power modulating system constructed as above.

SUMMARY OF THE INVENTION

It is therefore an object of the invention to provide an improved light power modulating system capable of preventing the above-described deficiencies of the light power modulating system.

For the above object, according to the invention, there is provided a light power modulating system for modulating output power of a laser diode. The light power modulating system is provided with a monitoring system that detects an output power of the laser diode and outputs a. voltage signal corresponding to the detected output power, an image signal output system that outputs an image signal representative of a thickness density of an image to be: formed, a first modifying system that modifies the image signal and outputs a modified image signal, a changing rate of the modified image signal between a first lower value and a first higher value being lower than that of the image signal, a differential amplifier that outputs an amplified difference between the modified image signal and the voltage signal output by the monitoring system, and a driving current generating system that generates a driving current for the laser diode based on the amplified difference output by the differential amplifier.

In particular, the first modifying system may include a high frequency attenuator.

In this case, the high frequency attenuator may include an active filter which reduces higher frequency signals more than lower frequency signals. Alternatively, the high frequency attenuator may include a passive filter which reduces higher frequency signals more than lower frequency signals.

Optionally, the detecting system may include a photodiode that receives the laser beam emitted by the laser diode and generates an electrical current corresponding to the intensity of the received laser beam. The detecting system may also include a current-to-voltage converter that converts the electrical current generated by the photodiode to a voltage corresponding to the electrical current.

Still optionally, the image signal output system may receive a digital signal representing the thickness density of the image to be formed and generates the image signal as an analog signal. An amplitude of the image signal corresponds to the thickness density of the image to be formed.

According to another aspect of the invention, there is provided a light power modulating system for modulating output power of a laser diode. The light power modulating system is provided with a monitoring system that detects an output power of the laser diode and outputs a voltage signal corresponding to the detected output power, an image signal output system that outputs an image signal representative of a thickness density of an image to be formed, a second modifying system that modifies the voltage signal and outputs a modified voltage signal, a changing rate of the modified voltage signal between a second lower value and a second higher value being higher than that of the voltage signal, a differential amplifier that outputs an amplified difference between the image. signal and the modified voltage signal output by the monitoring system, and a driving current generating system that generates a driving current for the laser diode based on the second amplified difference output by the differential amplifier.

Optionally, the light power modulating system may include a third modifying system that lowers a changing rate of the amplified difference between a third lower value and a third higher value.

In particular, the third modifying system may include a high frequency attenuator.

Still optionally, said second modifying system may include a high frequency booster.

In this case, the high frequency booster may include an active filter which boosts higher frequency signals more than lower frequency signals. Alternatively, the high frequency booster may be provided with a passive filter which boosts higher frequency signals more than lower frequency signals.

Further optionally, the detecting system may include a photodiode that receives the laser beam emitted by the laser diode and generates an electrical current corresponding to the intensity of the received laser beam. The detecting system may also include a current-to-voltage converter that converts the electrical current generated by the photodiode to a voltage corresponding to the electrical current.

Still optionally, the image signal output system may receive a digital signal representing the thickness density of the image to be formed and generate the image signal as an analog signal. An amplitude of the image signal corresponds to the thickness density of the image to be formed.

BRIEF DESCRIPTION OF THE ACCOMPANYING DRAWINGS

FIG. 1 schematically shows a block diagram of a conventional light power modulating circuit having an automatic power control (APC) function;

FIG. 2 schematically shows a structure of a scanning optical unit employing a light power modulating system according to a first embodiment of the invention;

FIGS. 5A–5E show waveforms illustrating an operation of the light power modulating system according to the first embodiment of the invention;

Figure 6:
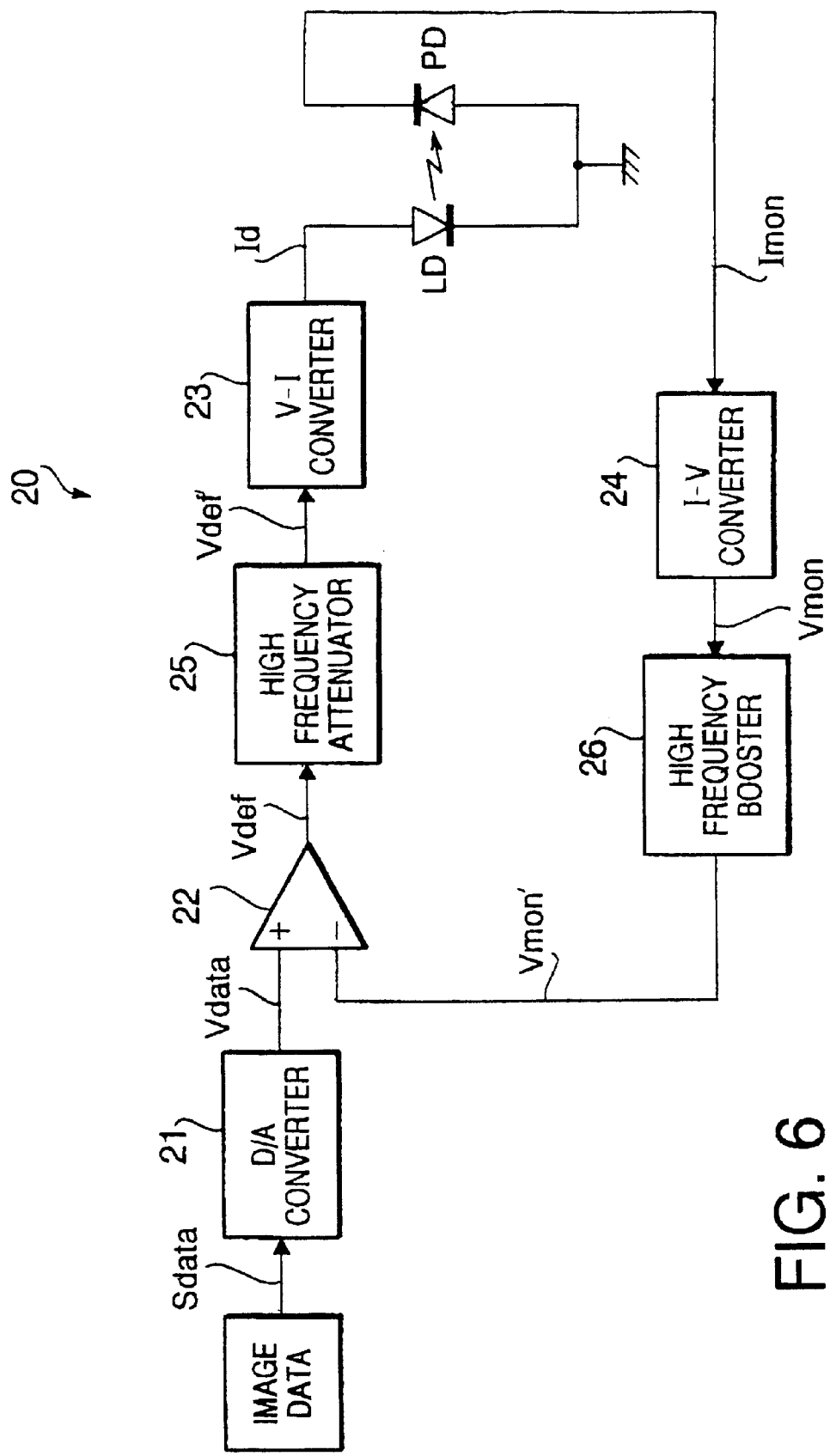

FIG. 6 schematically shows a block diagram of a light power modulating system, according to a second embodiment of the invention;

FIG. 7A schematically shows a circuit diagram of a high frequency boosting system according to the second embodiment of the present invention;

FIG. 7B shows a frequency response characteristic of the high frequency booster shown in FIG. 7A;

FIG. 7C shows a response to low frequency signals of the high frequency booster shown in FIG. 7A;

FIG. 7D shows a response to high frequency signals of the high frequency booster shown in FIG. 7A; and FIGS. 8A–8E show waveforms illustrating an operation of the light power modulating system according to the second embodiment of the invention.

DETAILED DESCRIPTION OF THE EMBODIMENTS

Figure 1:
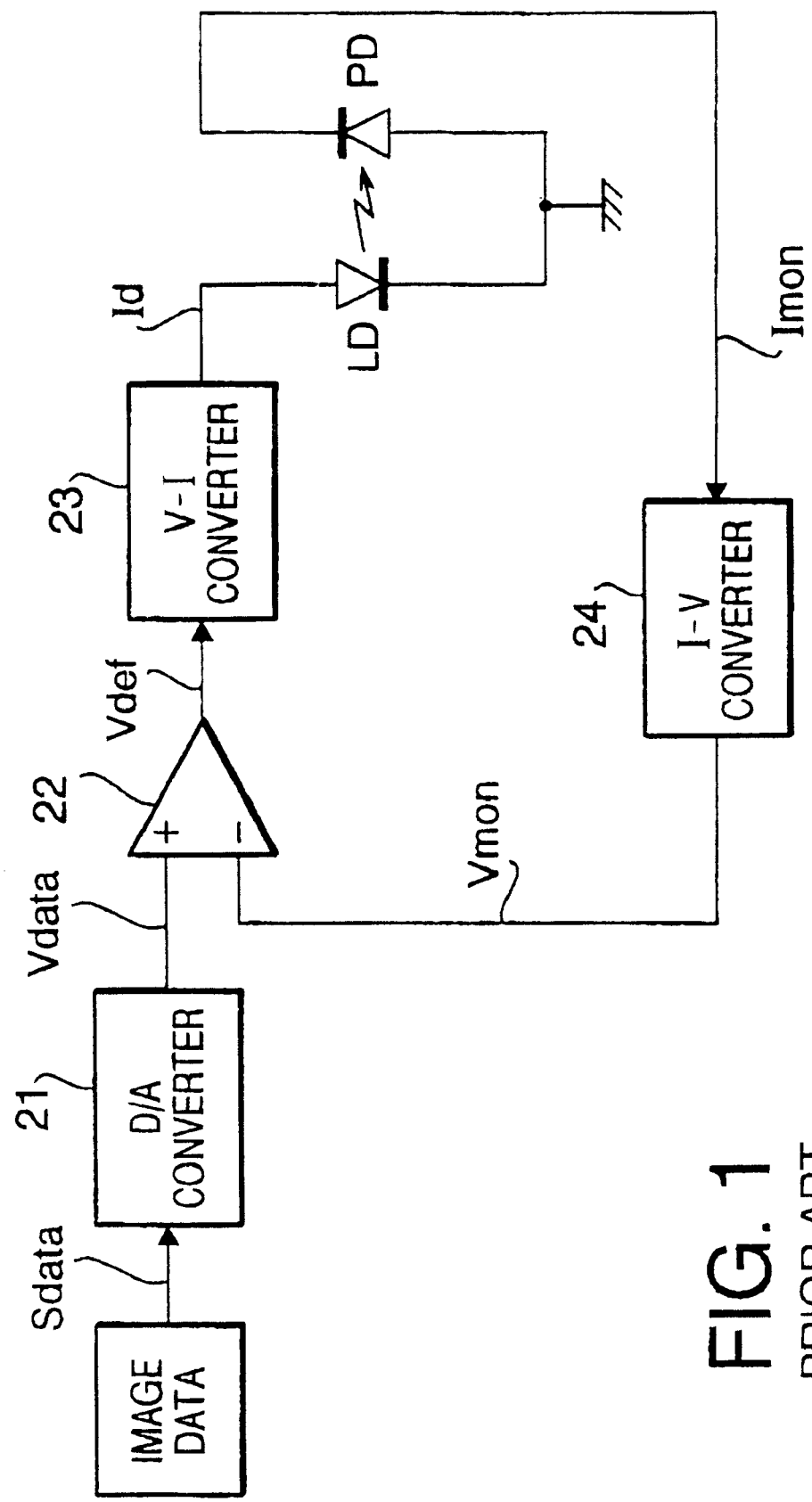
Figure 2:
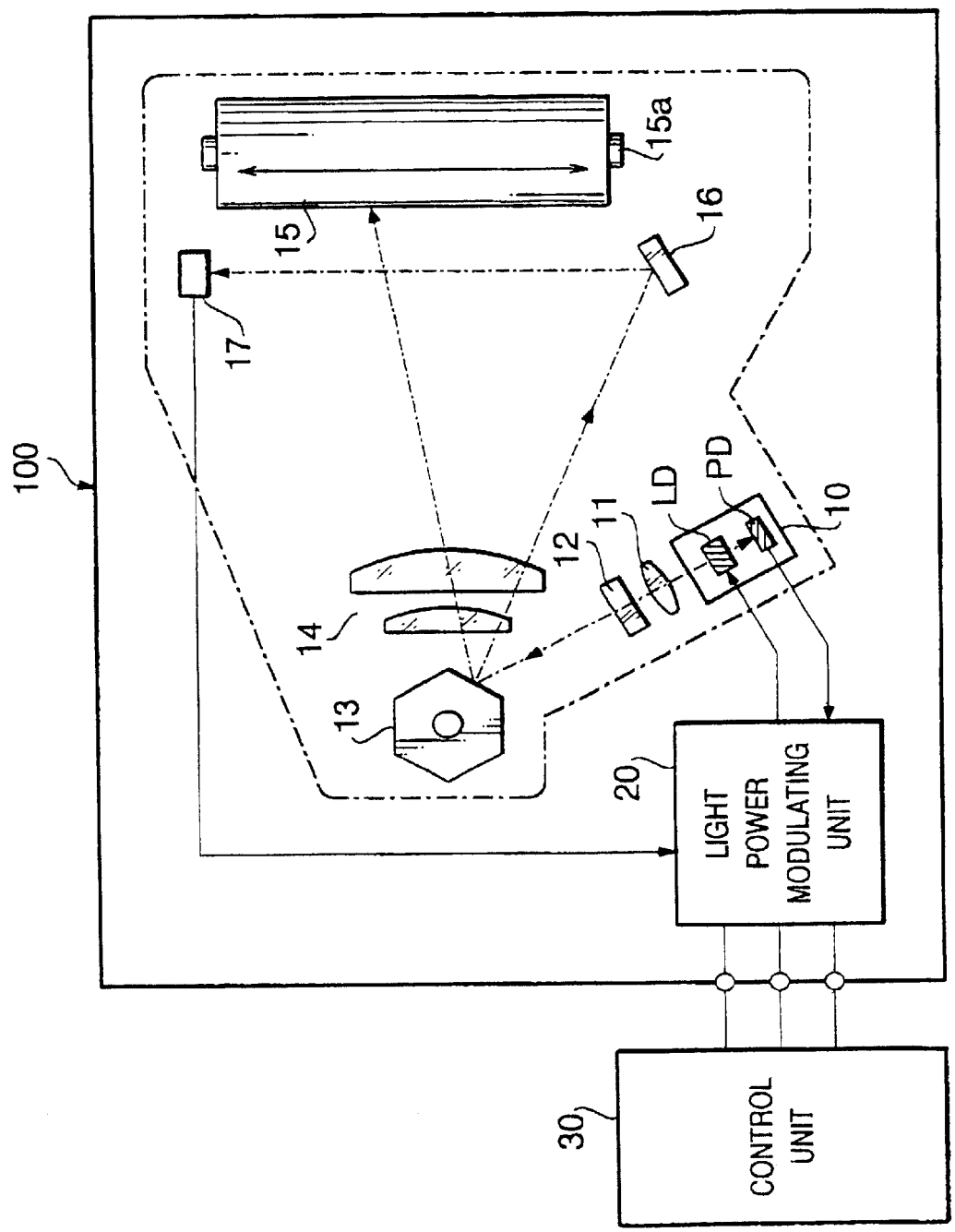

FIG. 2 schematically shows a configuration of a scanning optical unit 100 to which a light power modulating system according to first and second embodiments of the invention are applicable.

As shown in FIG. 2, the scanning optical unit 100 is provided with a laser module 10, which includes a laser diode LD and a photodiode PD as an integrally formed module. The photodiode PD is used for monitoring a laser beam (a back beam) emitted by the laser diode LD.

The laser beam emitted by the laser diode LD is collimated by a collimating lens 11 and is directed to pass through a cylindrical lens 12. The laser beam LB passed through the cylindrical lens 12 is directed to a reflecting surface of a polygonal mirror 13, which rotates at a high speed.

The laser beam LB is deflected by the polygonal mirror 13 to scan, in a main scanning direction, within a predetermined angular range. The scanning laser beam (i.e., the laser beam deflected by the polygonal mirror 13) passes through an fθ lens 14 and then converges on the circumferential surface, which is a photoconductive surface, of a photoconductive drum 15. The photoconductive drum 15 rotates about a rotation axis 15a which is parallel to the main scanning direction. Since the laser beam LB scans on the circumferential surface of the photoconductive drum 15 in a direction parallel with the rotation axis 15a, and the photoconductive drum 15 rotates, i.e., the surface of the photoconductive drum 15 moves with respect to the scanning laser beam LB in an auxiliary scanning direction, the circumferential surface of the photoconductive drum 15 is two-dimensionally scanned. As described in detail later, the laser beam is modulated during the scanning so that a two-dimensional image (latent image) is formed on the circumferential surface of the photoconductive drum 15.

A mirror 16 is provided beside one end of the photoconductive drum 15 within a range where the laser beam LB scans. The mirror 16 reflects the laser beam toward a photo detector 17, which is arranged beside the other end of the photoconductive drum 15. The photo detector 17 produces a synchronizing pulse, which synchronizes with each main scanning. The synchronizing pulse is used for generating a horizontal synchronizing signal.

As shown FIG. 2, the scanning optical unit 100 is also provided with a light power modulating circuit 20. The output signal of the photo detector 17 and an imaging signal transmitted from a control unit 30 are input to the light power modulating circuit 20.

The light power modulating circuit 20 modulates an output power of the laser diode LD. In addition, the light power modulating circuit 20 automatically controls an output power of the laser diode LD by monitoring intensity of the laser beam emitted by the laser diode LD, which will be described hereinafter.

FIRST EMBODIMENT

Figure 3:
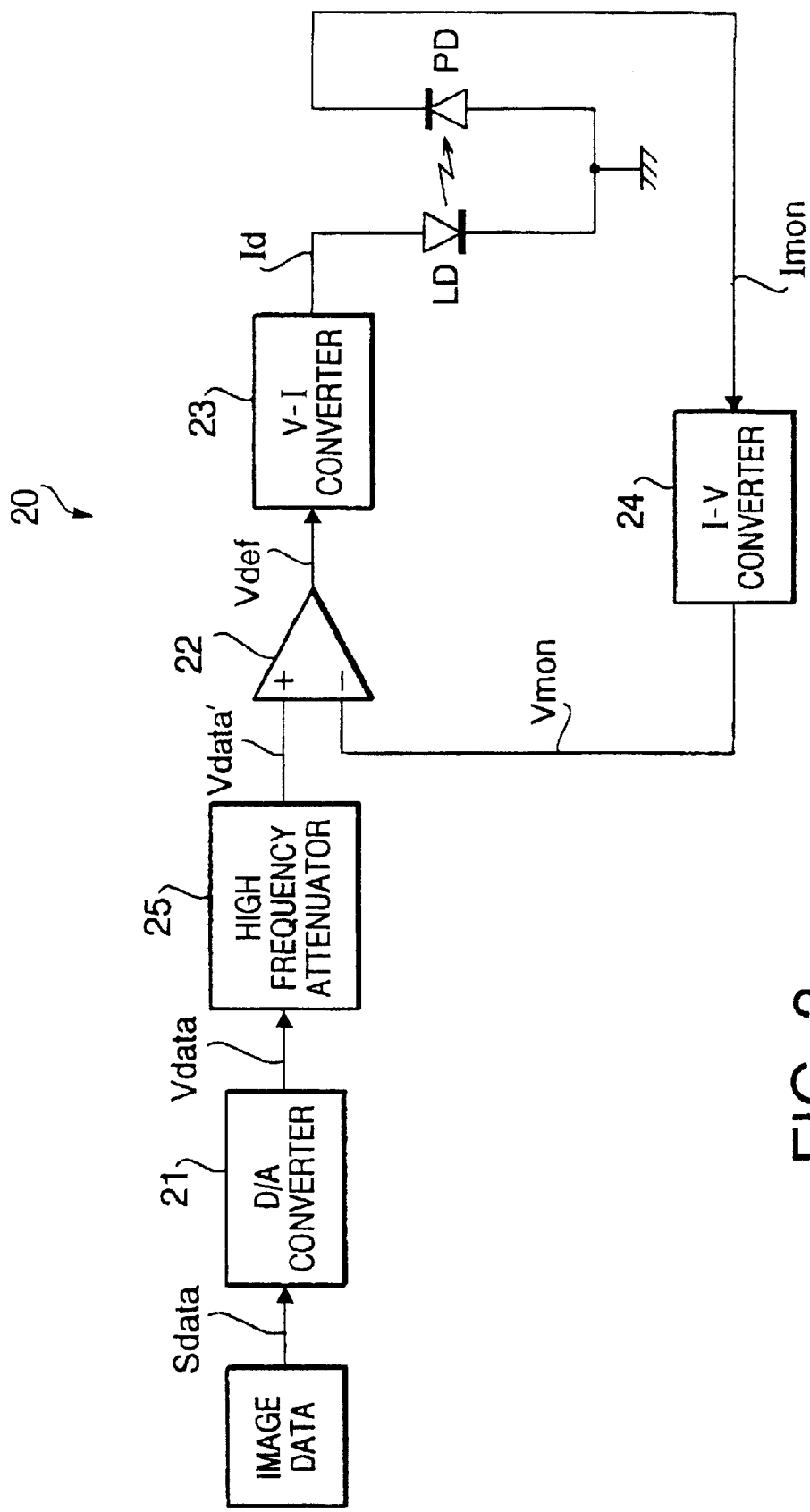
FIG. 3 shows a block diagram of the light power modulating system according to the first embodiment of the invention.

FIG. 3 is a block diagram of the light power modulating circuit 20 having an APC (automatic power control) function, according to a first embodiment. In FIG. 3, image data (Sdata) transmitted from the control unit 30 (FIG. 2) is input to a D/A converter 21, which converts the digital image data (Sdata) to an analog image signal (Vdata). This image signal (Vdata) is input to a positive input terminal of a differential amplifier 22 via a high frequency attenuator 25. The differential amplifier 22 amplifies a difference between a voltage of the image signal (Vdata') input to the positive terminal and a monitor voltage (Vmon) input to a negative input terminal, and outputs a difference signal (Vdef) representing the amplified difference between the input signals. The difference signal (Vdef) is transmitted to a V-I (voltage-to-current) converter 23. The voltage-to-current (V-I) converter 23 generates a driving current (Id) responsive to the difference signal (Vdef). The laser diode LD emits the laser beam when the driving current (Id) is supplied from the V-I converter 23.

When the laser beam LB is emitted by the laser diode LD, the backwardly emitted laser beam (the back beam) is received by the photodiode PD, which generates a monitor current (Imon) corresponding to the intensity of the received laser beam. A current-to-voltage (I-V) converter 24 converts the monitor current (Imon) to a monitor voltage (Vmon), which is, as described above, input to the negative input terminal of the differential amplifier 22.

Figure 4A:
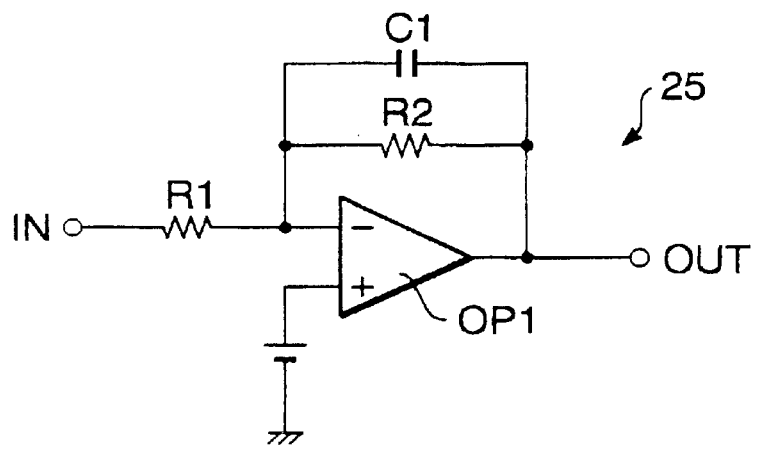
FIG. 4A shows an exemplary circuit of a high frequency attenuator.

The high frequency attenuator 25 (i.e., the low-pass filter) reduces the amplitude of a high frequency component of the input analog data signal (Vdata). The high frequency attenuator 25 is, for example, an active type low-pass filter including an operational amplifier OP1, resistors R1 and R2, and a capacitor C1 as shown in FIG. 4A. Alternatively, as a low-cost unit, the high frequency attenuator 25 may be a passive type low-pass filter consists of capacitors and inductors (not shown).

Figure 4B:
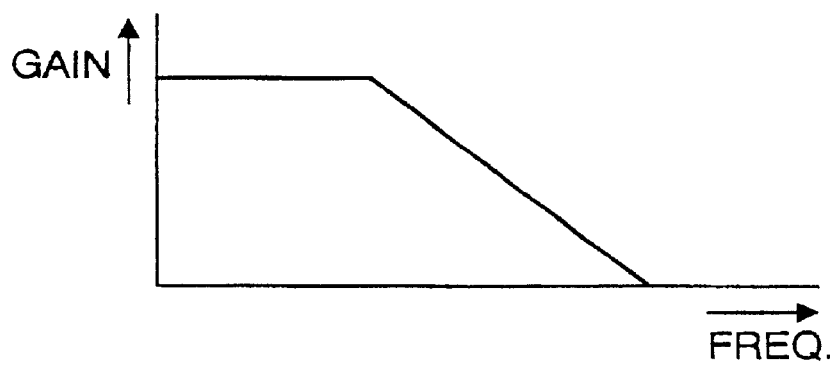
FIG. 4B shows a frequency response characteristic of the high frequency attenuator shown In FIG. 4A.
Figure 4C:
FIG. 4C shows a response to low frequency signals of the higher frequency attenuator shown in FIG. 4A.
Figure 4D:
FIG. 4D shows a response to high frequency signals of a higher frequency attenuator shown in FIG. 4A.

FIG. 4B shows a frequency response (gain versus frequency) characteristic of the high frequency attenuator 25. As shown in FIG. 4B, the gain of the high frequency attenuator 25 is high within a range of the low frequency, while, the gain decreases as the frequency increases in a range of the high frequency. Accordingly, the amplitude of a low frequency signal input to the high frequency attenuator 25 is reduced little as shown in FIG. 4C, and the amplitude of a high frequency signal input to the high frequency attenuator 25 is reduced more as shown FIG. 4D.

In the light power modulating circuit 20 in FIG. 3, image data (Sdata) is represented as 10 bit binary code whose maximum data value "1111111111" corresponds to the maximum darkness density (i.e., black) of the image to be printed, and the minimum data value "0000000000" thereof corresponds to the minimum darkness density (i.e., white) of the image to be printed. If the maximum output voltage of the D/A converter 21 is represented by Vmax, the D/A converter 21 outputs the voltage Vdata as one of the 1024 divided steps of a range between 0V and the maximum voltage (Vmax).

The operation of the configured light power modulating circuit 20 is now described. FIGS. 5A–5E show waveforms when the image data (Sdata) changes from a low value to high value.

FIG. 5A shows an exemplary waveform of the image signal (Vdata) output by the D/A converter 21 when the image data (Sdata) changes from a low value to a high value. The output image signal (Vdata) rises quickly, according to its characteristic of a quick response, as shown in FIG. 5A.

The image signal (Vdata) is input to the high frequency attenuator 25, where the high frequency components included in the image signal (Vdata) is attenuated. Accordingly, a slope of the rising end of the modified image signal (Vdata') (indicated by a solid line), which is output by the high frequency attenuator 25, is gentler than that of the image signal (Vdata) (indicated by broken lines), as shown in FIG. 5B. It should be noted that the changing rate of the rising end of the modified image signal (Vdata') is lowered in comparison to that of the image signal (Vdata).

The modified image signal (Vdata') is input to the positive input terminal of the differential amplifier 22. To the negative input terminal of the differential amplifier 22, the monitor voltage (Vmon) is applied. The differential amplifier 22 outputs the difference signal Vdef, which represents the amplified difference between the modified image signal (Vdata') and the monitor signal (Vmon). The difference signal (Vdef) is converted into the driving current (Id) by the V-I converter 23, and the driving current (Id) is supplied to the laser diode LD. Thus, when the modified image signal (Vdata') changes as shown in FIG. 5B, the output power of the laser diode LD increases. As the output power of the laser diode LD increases, the monitor voltage (Vmon) also increases, which is applied to the negative terminal of the differential amplifier 22. Then, the difference signal (Vdef) of the differential amplifier 22 decreases, and a further increase of the driving current is suppressed. Thus, as a result, the output power of the laser diode LD is set to correspond to the image signal (Vdata) using the APC function. The driving current (Id) in this case is shown by a solid line in FIG. 5E.

If the photodiode PD and the I-V converter 24 are not quick response type elements/circuits, the responsive characteristics, when the output power of the laser diode LD starts to increase and the monitor signal Vmon reaches a value corresponding to the output power of the laser diode LD, is relatively gentle as shown in FIG. 5C. Therefore, if the image signal (Vdata) shown in FIG. 5A is directly input to the differential amplifier 22 as it is, the difference between the image singal (Vdata) and the monitor signal Vmon is too large, which results in the large difference signal Vdef. In such a case, an overcurrent Id' may be supplied to the laser diode LD, as shown in FIG. 5D, and the laser diode LD may be broken. In FIG. 5D, the rising end of the image signal Vdata and the rising end of the monitored signal Vmon are indicated by broken lines for reference purpose.

According to the first embodiment, however, the high frequency attenuator 25 is provided upstream of the input terminal of the differential amplifier 22. Thus, the modified image signal Vdata', whose rising end is made gentle, is input to the differential amplifier 22. With this structure, even if the responsive characteristics of the photo diode PD and the I-V converter 24 are not high, the rising end of the monitor voltage (Vmon) can follow the rising end of the modified image signal (Vdata') as shown in FIG. 5C, since the rising end of the modified image signal (Vdata') is made sufficiently gentle. Accordingly, the waveform of the driving current (Id) output by the V-I converter 23 does not increase excessively as shown in FIG. 5E. In FIG. 5E, the rising end of the image signal Vdata' and the rising end of the monitored signal Vmon are indicated by broken lines for reference purpose.

Although not shown, when the image signal (Vdata) decreases quickly, the quick change of the image signal (Vdata) is converted to a gentle change of the modified image signal (Vdata') before it is input to the differential amplifier 22, and therefore, the driving current (Id) is prevented from decreasing excessively. Therefore, the output power of the laser diode LD may not be unintentionally changed to too small.

As described above, the high frequency attenuator 25 in FIG. 3 plays an important role in preventing the possibility of damage to the laser diode LD. Therefore, even if quick response elements/circuits are not used as the photodiode PD, the I-V converter 24, the differential amplifier 22, and V-I converter 23, excessively high or low output power of the laser diode LD, when the image signal (Vdata) is changed quickly, can be prevented. Further, since the high frequency attenuator 25 is comprised of a generally used operational amplifier and some passive components, it can be manufactured at low cost.

SECOND EMBODIMENT

FIG. 6 is a block diagram of a light power modulating circuit 200 according to a second embodiment of the present invention. In FIG. 6, the blocks having the same functions as the blocks of the light power modulating circuit 20 according to the first embodiment have the same reference numbers assigned.

In FIG. 6, image data (Sdata) is transmitted from the control unit 30 to a D/A converter 21, which converts the digital image data (Sdata) to an analog image signal (Vdata). This image signal (Vdata) is directly input to a positive input terminal of the differential amplifier 22. The differential amplifier 22 amplifies a difference between the image signal (Vdata) and a monitor voltage (Vmon) applied to the negative input terminal, and outputs a difference signal (Vdef) representing the amplified difference therebetween. The difference signal (Vdef) is input to a V-I converter 23 via a high frequency attenuator 25. The high frequency attenuator 25 reduces a high frequency component of the difference signal (Vdef), similarly to that in the first embodiment described with reference to FIG. 4, and outputs a modified difference signal (Vdef'), which is transmitted to the V-I converter 23.

A voltage-to-current (V-I) converter 23 generates a driving current (Id) responsive to the modified difference signal (Vdef').

When the laser beam is emitted by the laser diode LD, the backwardly emitted laser beam (the back beam) is received by the photodiode PD, which generates a monitor current (Imon) corresponding to the intensity of the received laser beam. The current-to-voltage (I-V) converter 24 generates a monitor voltage (Vmon) corresponding to the monitor current (Imon). The monitor voltage (Vmon) is input to the differential amplifier 22 via a high frequency booster 26, which boosts the high frequency component of the monitor voltage (Vmon), and outputs a modified monitor voltage (Vmon') to the differential amplifier 22.

The high frequency booster 26 may be comprised of an operational amplifier OP2, resistors R3 and R4, and a capacitor C2 as shown in FIG. 7A. FIG. 7B is a frequency response (i.e., gain versus frequency) characteristic of the high frequency booster 26. As shown in FIG. 7B, the high frequency booster 26 exhibits a low gain within a range of a low frequency, and the gain gradually increases toward a higher frequency within a range of a high frequency. The high frequency booster 26 is configured such that when a low frequency signal and a high frequency signal having the same amplitude are input, the amplitude of the output high frequency signal is greater than the amplitude of the output low frequency signal.

FIGS. 8A–8E show waveforms, when the image data (Sdata) quickly changes from a low value to a high value.

Figure 8A:
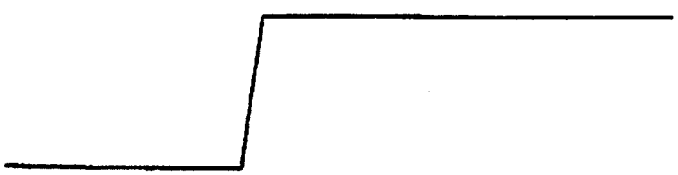

FIG. 8A shows an operating characteristic of the D/A converter 21 when the image data (Sdata) changes from a low value to a high value. An output signal (Vdata) increases rapidly according to its characteristic of quick response as shown in FIG. 8A.

The image signal (Vdata) is directly input to the differential amplifier 22. The output difference signal (Vdef) of the differential amplifier 22 changes to high voltage responsive to the image signal (Vdata). To the negative input terminal of the differential amplifier 22, the modified monitor signal (Vmon') output by the high frequency booster 26 is applied. The differential amplifier 22 outputs the difference signal (Vdef), which is an amplified difference between the image signal (Vdata) and the modified monitor signal (Vmon'). The difference signal (Vdef) is input to the V-I converter 23 via the high frequency attenuator 25. The driving current (Id) generated by the V-I converter 23 is supplied to the laser diode LD. Thus, the output power of the laser diode LD changes to high in accordance with the change of the difference signal Vdef. When the output power of the laser diode LD changes from a low output power to a high output power, the monitor voltage (Vmon) changes from a low value to a high value, and accordingly, the modified monitor voltage (Vmon') also increases. Then, the difference signal (Vdef) output by the differential amplifier 22 decreases, the modified difference signal (Vdef') output by the high frequency attenuator 25 decreases, and therefore, further increase of the driving current (Id) is suppressed.

Figure 8B:
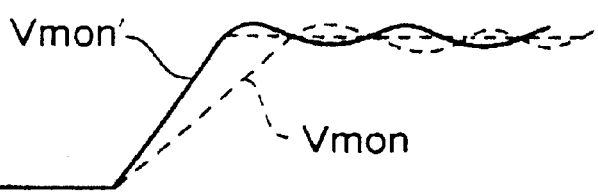
Figure 8C:
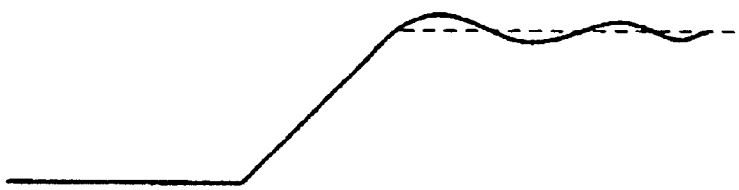
Figure 8D:
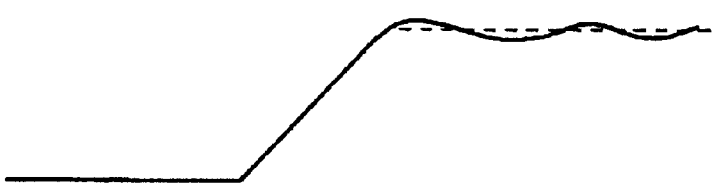
Figure 8E:

In the above operation, the monitor voltage (Vmon) is input to the high frequency booster 26, where the high frequency component is amplified greater than the low frequency component. Therefore, the monitor voltage (Vmon) is converted to the modified monitor voltage (Vmon'), that is, the rising end of the monitor voltage (Vmon) is changed to a steep inclination of the modified monitor voltage (Vmon') as shown in FIG. 8B. Thus, the modified monitor voltage (Vmon') reaches the predetermined voltage quickly (i.e., the changing rate is increased). Since the image signal (Vdata) and the modified monitor voltage (Vmon') quickly changes, the difference signal (Vdef) changes relatively slowly (i.e., the changing rate is decreased) as shown in FIG. 8C. Further, the difference signal (Vdef) is input to the high frequency attenuator 25 and the rising end of the wave form is made gentle. A signal output by the high frequency attenuator 25 (Vdef) is shown in FIG. 8D.

Therefore, even if the responsive characteristics of the photodiode PD and/or the I-V converter 24 are relatively low, the monitor voltage (Vmon) is modified to have an improved rising characteristic (i.e., the modified monitor voltage Vmon'), and the responsive characteristics is made quick as a whole. Accordingly, it becomes possible to prevent the driving current (Id) output by the V-I converter 23 from increasing excessively (see FIG. 8E).

Although not shown, when the image. signal (Vdata) decreases quickly, the quick change of the image signal (Vdata) is converted to a gentle change of the difference signal (Vdef), and therefore, the driving current (Id) is prevented from decreasing excessively. Therefore, the output power of the laser diode LD may not be unintentionally changed to an excessively small value.

As described above, the high frequency booster 26 and the high frequency attenuator 25 play a role in preventing the possibility of damage to the laser diode LD. Therefore, there is no need to use quick response components as the photodiode PD, the I-V converter 24, the differential amplifier 22, and V-I converter 23. In addition, since the high frequency booster 26 is comprised of a generally used operational amplifier and some passive components, the high frequency booster circuit 26 can be made at low cost.

The embodiments described above can be modified in various ways without departing from the scope of the invention. For example, since the high frequency booster 26 plays an important role in preventing the possibility of damage to the laser diode LD, the high frequency attenuator 25 in the light power modulating circuit 200 can be omitted. In addition, the high frequency attenuator 25 described with reference to FIG. 4 and the high frequency booster 26 described with reference to FIG. 7 can be replaced with any other suitable circuit which is known by a person skilled in the art.

The present disclosure relates to the subject matter contained In Japanese Patent Application No. HEI 11-369190, filed on Dec. 27, 1999, which is expressly incorporated herein by reference in its entirety.

What is claimed is:

1. A light power modulating system for modulating output power of a laser diode, comprising:
    a monitoring system that detects an output power of the laser diode and outputs a voltage signal corresponding to the detected output power;
    an image signal output system that outputs an image signal representative of a thickness density of an image to be formed;
    a first modifying system that modifies the image signal and outputs a modified image signal, a changing rate of said modified image signal between a first lower value and a first higher value being lower than that of said image signal;
    a differential amplifier that outputs an amplified difference between said modified image signal and said voltage signal output by said monitoring system; and
    a driving current generating system that generates a driving current for the laser diode based on said amplified difference output by said differential amplifier.

2. The light power modulating system according to claim 1, wherein said first modifying system includes a high frequency attenuator.

3. The light power modulating system according to claim 2, wherein said high frequency attenuator comprises an active filter which reduces higher frequency signals more than lower frequency signals.

4. The light power modulating system according to claim 2, wherein said high frequency attenuator comprises a passive filter which reduces higher frequency signals more than lower frequency signals.

5. The light power modulating system according to claim 1, wherein said monitoring system includes a photodiode that receives a laser beam emitted by the laser diode and generates an electrical current corresponding to the intensity of the received laser beam, and a current-to-voltage converter that converts the electrical current generated by said photodiode to a voltage corresponding to the electrical current.

6. The light power modulating system according to claim 1, wherein said image signal output system receives a digital signal representing the thickness density of the image to be formed and generates the image signal as an analog signal, an amplitude of the image signal corresponding to the thickness density of the image to be formed.

7. A light power modulating system for modulating output power of a laser diode, comprising:
    a monitoring system that detects an output power of the laser diode and outputs a voltage signal corresponding to the detected output power;
    an image signal output system that outputs an image signal representative of a thickness density of an image to be formed;
    a first modifying system that modifies the voltage signal output by said monitoring system and outputs a modified voltage signal, a changing rate of said modified voltage signal between a first lower value and a first higher value being higher than that of said voltage signal;
    a differential amplifier that outputs an amplified difference between said image signal and said modified voltage signal output by said image signal and said modified voltage signal output by said first modifying system; and
    a driving current generating system that generates a driving current for the laser diode based on said amplified difference output by said differential amplifier.

8. The light power modulating system according to claim 7, further including a second modifying system that lowers a changing rate of the amplified difference between a second lower value and a second higher value.

9. The light power modulating system according to claim 8, wherein said second modifying system includes a high frequency attenuator.

10. The light power modulating system according to claim 7, wherein said first modifying system includes a high frequency booster.

11. The light power modulating system according to claim 10, wherein said high frequency booster comprises an active filter which boosts higher frequency signals more than lower frequency signals.

12. The light power modulating system according to claim 10, wherein said high frequency booster comprises a passive filter which boosts higher frequency signals more than lower frequency signals.

13. The light power modulating system according to claim 7, wherein said monitoring system includes a photodiode that receives a laser beam emitted by the laser diode and generates an electrical current corresponding to the intensity of the received laser beam, and a current-to-voltage converter that converts the electrical current generated by said photodiode to a voltage corresponding to the electrical current.

14. The light power modulating system according to claim 7, wherein said image signal output system receives a digital signal representing the thickness density of the image to be formed and generates the image signal as an analog signal, an amplitude of the image signal corresponding to the thickness density of the image to be formed.

* * * * *